United States Patent [19]

Ciaccio

[11] Patent Number: 5,088,005
[45] Date of Patent: Feb. 11, 1992

[54] COLD PLATE FOR COOLING ELECTRONICS

[75] Inventor: Michael P. Ciaccio, Rockford, Ill.

[73] Assignee: Sundstrand Corporation, Rockford, Ill.

[21] Appl. No.: 520,801

[22] Filed: May 8, 1990

[51] Int. Cl.$^5$ .............................................. H05K 7/20
[52] U.S. Cl. .................... 361/385; 165/86.4; 165/104.33; 357/82; 361/382; 361/386
[58] Field of Search .................. 165/80.3, 104.33, 166, 165/167, 908; 174/15.1, 15.2, 16.3; 357/82; 361/382, 384–389

[56] References Cited

U.S. PATENT DOCUMENTS

| | | | |
|---|---|---|---|
| 3,327,776 | 6/1967 | Batt | 361/382 |
| 4,347,897 | 9/1982 | Sumitomo et al. | 165/167 |
| 4,494,171 | 1/1985 | Bland et al. | 361/386 |
| 4,559,580 | 12/1985 | Lutfy | 361/385 |
| 4,712,158 | 12/1987 | Kikuchi et al. | 361/385 |
| 4,884,168 | 11/1989 | August et al. | 361/382 |
| 4,962,444 | 10/1990 | Niggemann | 361/382 |

Primary Examiner—Gregory D. Thompson
Attorney, Agent, or Firm—Antonelli, Terry Stout & Kraus

[57] ABSTRACT

A multi-layered cold plate is customized for cooling a plurality of electronic components to be arranged in thermal communication with the cold plate by dividing the cold plate into a plurality of hypothetical cooling zones, determining the cooling needed for the respective cooling zones for cooling the electronic components adjacent the zones, and tailoring a heat exchanger layer of the multi-layered cold plate with different heat exchanger structures in respective cooling zones to provide relatively high and relatively lower efficiency cooling where needed. A coolant flow, jet impingement heat exchange structure formed of alternately stacked orifice plates and spacer plates provides the high efficiency cooling. The heat exchanger layer is the only layer of the cold plate which must be customized for accommodating a particular arrangement of electronic components to be cooled.

20 Claims, 5 Drawing Sheets

COLD PLATE FOR COOLING ELECTRONICS

TECHNICAL FIELD

The present invention relates to a cold plate for cooling electronics and a method of making a cold plate. More particularly, the invention relates to an improved cold plate and method for cooling aircraft avionics which can effectively dissipate extremely high local heat fluxes ($\geq 100$ watts/cm$^2$) as well as total heat loads of 500–2,000 watts per printed circuit board attached to the cold plate.

BACKGROUND ART

Current aluminum cold plane avionics cooling technology utilizing solid conduction cold plates limits total printed circuit board power dissipations to roughly 50 watts. Heat pipe technology is not compatible with many electronic components due to local heat flux limitations of approximately 5 watts/cm$^2$ and heat pipe technology is not well suited for aircraft or space applications due to inherent sensitivity to "g" forces and attitude. Reflux technology offers higher local heat fluxes but is also sensitive to "g" forces and attitude. Airflow through printed circuit boards have inherently low heat transfer coefficients and large pressure drops, and therefore, require large flow cross-sectional areas and large heat transfer areas. Hence printed circuit boards with airflow therethrough typically cannot be fitted into current aircraft standard geometries, thus requiring costly non-standard mounting procedures, components and connectors.

Thus, there is a need for an improved method and apparatus for cooling aircraft avionics which can effectively dissipate extremely high local heat fluxes ($\geq 100$ watts/cm$^2$) as well as total heat loads of 500–2,000 watts per printed circuit board. The apparatus must be insensitive to "g" forces and attitude, have a low pressure drop, fit into current aircraft standard geometries, and must not be cost prohibitive.

Compact high intensity coolers or heat exchangers (CHIC) are known. Unlike conventional heat exchangers, the former can efficiently handle relatively high heat fluxes in a small volume with relatively low power requirements for pumping a heat exchange fluid, see for example U.S. Pat. No. 4,559,580. These heat exchangers comprise a series of plates including alternating orifice plates and baffle plates. The orifice plates have coolant flow impingement orifices extending therethrough. U.S. Pat. No. 4,494,171 discloses another example of an impingement cooling apparatus for heat liberating device.

A cooling plate through which a liquid coolant is circulated for cooling electronic circuit components, such as integrated circuit chips or semiconductor elements, mounted on a printed circuit board is disclosed in U.S. Pat. No. 4,712,158. A plate-type heat exchanger comprising heat transfer plates serving as heat transfer elements, and jet plates each having a number of small holes, is disclosed in U.S. Pat. No. 4,347,897.

DISCLOSURE OF INVENTION

An object of the present invention is to provide an improved cold plate for cooling electronics and a method of making the same which can effectively dissipate extremely high local heat fluxes ($\geq 100$ watts/cm$^2$) as well as total heat loads of 500–2,000 watts per printed circuit board. Another object is to provide an improved cold plate for cooling electronics which is insensitive to "g" forces and attitude, has a low coolant flow pressure drop, fits into current aircraft standard geometries, and is cost effective for use in aircraft.

A further object of the invention is to provide an improved cold plate and a method of making the same which utilize the concept of multiple jet impingement cooling for dissipating extremely local heat fluxes and total heat loads of 500–2,000 watts per standard electronic module printed circuit board using a single phase, pumped liquid coolant loop so that the cold plate is insensitive to "g" force and attitude with a low pressure drop for the coolant circulated through the cold plate.

A still further object of the invention is to provide an improved method of customizing a multi-layered cold plate through which a cooling liquid is to be flowed for cooling a plurality of electronic components which produce different amounts of heat and which are to be placed in a particular arrangement in thermal communication with the cold plate whereby only a single heat exchanger layer of the multi-layered cold plate has to be custom made or tailored to meet the varied cooling requirements in a plurality of hypothetical cooling zones of the cold plate which the electronic components are to be placed in thermal communication with.

These and other objects are attained by the cold plate of the invention for cooling electronics which comprises a plurality of layers which are assembled in stacked relation. The plurality of layers include a heat exchanger layer. Means are also provided for defining a flow path for circulating a cooling fluid through the cold plate for cooling electronics located in heat conducting relation to the cold plate. The flow path extends through a plurality of cooling zones of the cold plate. Portions of the heat exchanger layer are located in the respective cooling zones for heat exchange with coolant circulated along the flow path.

The heat exchanger layer is formed of a plurality of stacked plates forming at least one first heat exchanger structure for relatively high efficiency cooling and at least one second heat exchanger structure for relatively lower efficiency cooling. The first and second heat exchanger structures are located in respective ones of the cooling zones whereby for heat removal efficiency a relatively high heat producing electronic component can be located adjacent one of the cooling zones with a first heat exchanger structure associated therewith and a relatively lower heat producing electronic component can be located adjacent one of the cooling zones with a second heat exchanger structure associated therewith.

In the disclosed, preferred form of the invention, the plurality of layers of the cold plate include a top plate and a bottom plate. The heat exchanger layer is located intermediate to the top and bottom plates. The layers further include a top target and spacer plate located between the top plate and the heat exchanger layer and a bottom target and spacer plate located between the bottom plate and the heat exchanger layer. The flow path conducts cooling liquid back and forth through the heat exchanger layer in successive cooling zones between the top and bottom target spacer plates. The disclosed form of the cold plate is planar with the coolant flow path therethrough extending serpentine in the plane of the cold plate.

The first heat exchanger structure for relatively high efficiency cooling comprises a plurality of orifice and spacer plates. The orifice plates have coolant flow impingement orifices extending therethrough to create jets of coolant which impinge on the heat exchanger structure. The orifice and spacer plates are stacked alternately and bonded to another as by brazing or diffusion bonding to provide for the removal of dissipated heat at relatively high heat fluxes from a relatively high heat producing electronic component or components. As a result, the cold plate in a cooling zone having a first heat exchanger structure associated therewith is capable of effectively dissipating local heat fluxes of $\geq 100$ watts/cm$^2$ from a heat producing electronic component.

The second heat exchanger structure of the illustrated embodiment is formed by providing relatively large apertures extending through each of the plurality of stacked plates of the heat exchanger layer with the apertures of the respective plates at a given cooling zone being aligned with one another for essentially free flow of the coolant therethrough from one side of the heat exchanger layer to the opposite side in a direction along the flow path through the cold plate. This structure provides a relatively lower efficiency cooling as compared with the first heat exchanger structure for cooling relatively lower heat producing electronic components located adjacent the cooling zone having the second heat exchanger structure associated therewith.

Printed circuit boards may be attached to one or both of opposite sides of the multi-layer cold plate in the same manner as they are currently attached to solid conduction cold plates, e.g. by adhesively bonding. The cold plate is also preferably dimensioned to fit in a standard printed circuit board rack for supporting and cooling the printed circuit board or boards and the electronic components thereon attached to the cold plate. The improved cold plate of the invention is capable of effectively dissipating heat fluxes from electronics of $\geq 500$ watts per printed circuit board attached to the cold plate.

A method of making a cold plate according to the invention comprises forming the cold plate of at least three layers arranged in stacked relation with a liquid coolant flow path being formed therein which extends back and forth through an intermediate layer to layers on opposite sides of the intermediate layer at a plurality of spaced locations in the cold plate to define respective cooling zones, wherein the intermediate layer is provided with at least one first exchanger structure for relatively high efficiency cooling and at least one second heat exchanger structure for relatively lower efficiency cooling, the first and second heat exchanger structures being located in respective ones of the cooling zones. The several layers of the cold plate are preferably made of heat conductive metal such as aluminum or copper with the layers being bonded to one another by brazing or diffusion bonding.

The invention also involves a method of customizing a multi-layer cold plate through which a cooling liquid is to be flowed for cooling a plurality of electronic components which produce different amounts of heat and which are to be placed in a particular arrangement in thermal communication with the cold plate. The method comprises the steps of dividing the cold plate into a plurality of hypothetical cooling zones, determining the cooling needed for the respective cooling zones for cooling the electronic components to be located adjacent the zones according to the particular arrangement, and tailoring a heat exchanger layer which is to form a part of the multi-layered cold plate by providing at least two different heat exchanger structures having different cooling efficiencies in respective ones of the cooling zones in accordance with the determined needs of the cooling zones. With the improved cold plate of the invention, only one of the plurality of layers of the cooling plate must be "customized" by placing either a first heat exchanger structure for relatively high efficiency cooling, such as a CHIC type heat exchanger structure, or a second heat exchanger structure having a relatively lower efficiency cooling, e.g. a relatively large aperture or "blank", in the predetermined locations corresponding to the cooling zones. High power devices then can be mounted adjacent the first heat exchanger structure locations, medium power devices can be mounted adjacent the second heat exchanger structure locations and low power devices can be mounted anywhere on the remaining board area. Electronic components may be mounted on either side of the cold plate, since the CHIC cooling performance is approximately the same whether the liquid is flowing toward a heat source or away from it.

These and other objects, features and advantages of the present invention will become more apparent from the following description when taken in connection with the accompanying drawings, which show, for the purpose of illustration only, one preferred embodiment in accordance the present invention.

BEST MODE FOR CARRYING OUT THE INVENTION

Figure 11:
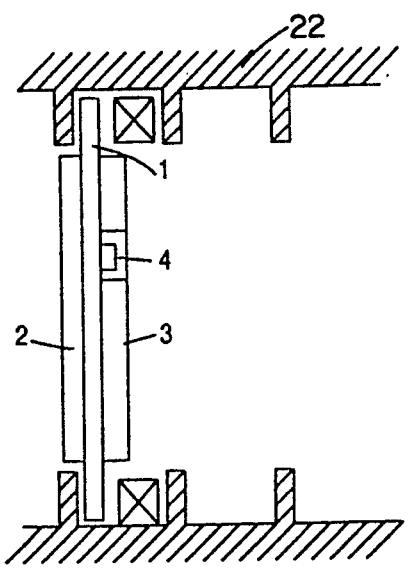
FIG. 11 is a side view, partially in cross-section, of a standard printed circuit board rack with a cold plate of the invention located therein, two printed circuit boards being attached to the opposite sides of the cold plate.
Figure 12:
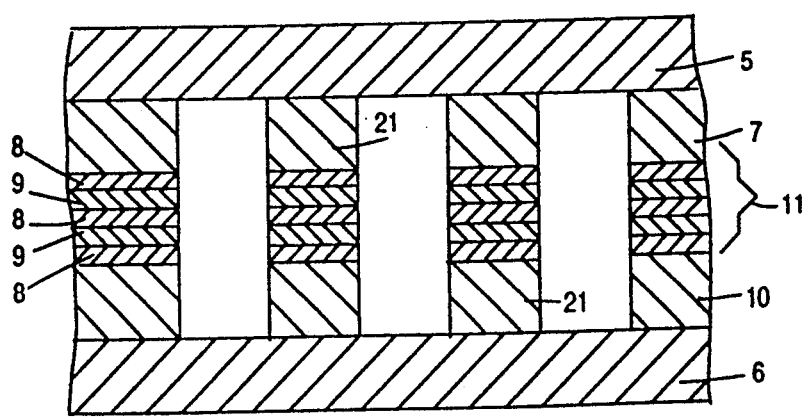
FIG. 12 is a cross-sectional view of a portion of the cold plate of FIGS. 1 and 2 taken along the line 6—6 in FIG. 2 and illustrating the relatively lower efficiency cooling heat exchanger structure.

Referring now to the drawings, a cold plate 1 of the invention is for cooling electronics, particularly printed circuit boards 2 and 3 and the electronic components thereof, see electronic component 4 of printed circuit board 3, for example, in FIG. 11. The printed circuit boards 2 and 3 are attached to the cold plate 1 in the same manner printed circuit boards are currently attached to a solid conduction cold plane, i.e. by adhesively bonding, for example.

The cold plate 1 comprises a plurality of layers 5, 6, 7, 10 and 11 which are assembled in stacked relation and bonded to one another. The materials of the several layers are preferably formed of a heat conductive metal such aluminum or copper. The assembled layers are preferably joined to one another by brazing, if the materials are aluminum, and by diffusion bonding, if the materials are copper. The terms aluminum and copper refer to the metals themselves and also alloys thereof.

More particularly, the cold plate 1 is made up of five types of layers; 1) top and bottom plates, 5 and 6 in the depicted embodiment; 2) top target spacer plate, 3) orifice plates, 8; 4) spacer plates, 9; and 5) bottom target spacer plate, 10. The orifice and spacer plates when assembled constitute a heat exchanger layer 11 in the cold plate as discussed in more detail below. The disclosed embodiment employs three orifice plates 8 and two spacer plates 9 to form a heat exchanger layer 11. However, the number of orifice and spacer plates is design dependent and can be varied. Preferably, three to eight orifice plates are stacked alternatively with an appropriate number of spacer plates to form the heat exchanger layer 11. The several layers the cold plate are preferably between 0.004 and 0.020 inch thick with the total thickness of the cold plate 1 being less than 0.130 inch to fit into standard aircraft geometries, e.g. in printed circuit board rack 22, FIG. 11.

Figure 1:
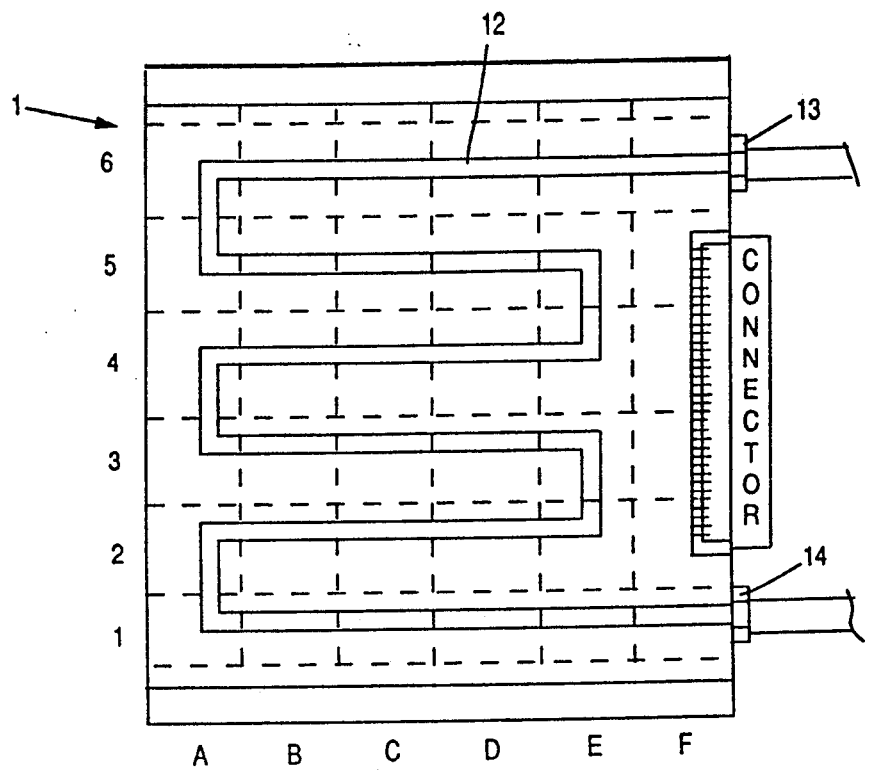
FIG. 1 is a top view of a cold plate according to a preferred embodiment of the invention wherein the flow path of liquid coolant through the plane of the cold plate has been indicated thereon along with the hypothetical cooling zones which are cooled by the circulated liquid.
Figure 2:
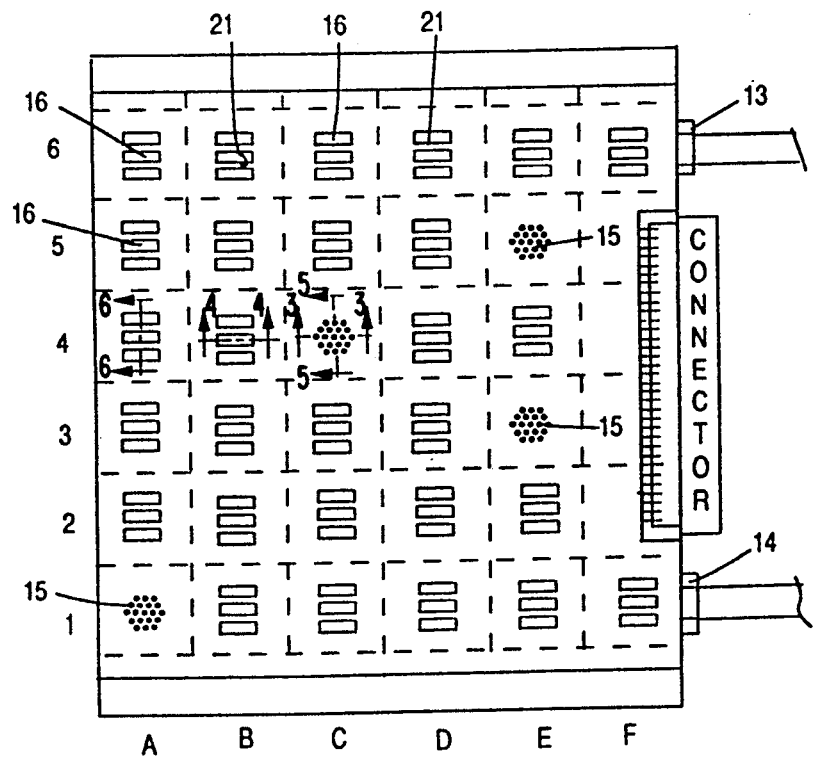
FIG. 2 is a top view of the cold plate shown in FIG. 1 to which schematic diagrams have been added in the various cooling zones to illustrate the relative cooling efficiency or heat exchanger structure which occurs in each zone.

The cold plate 1 further includes a fluid passage 12 which extends through the cold plate in serpentine fashion in the plane of the cold plate, see FIG. 1, between an inlet fitting 13 and an outlet fitting 14. The passage 12 serves as a flow path through the cold plate for circulating a cooling liquid for cooling electronics located in heat conducting relation to the cold plate. The liquid coolant flowing along the passage 12 also travels alternately up and down through the heat exchanger layer 11 at a plurality of spaced locations along the flow path corresponding to respective ones of predetermined, hypothetical cooling zones as delineated by the dashed lines in FIGS. 1 and 2. More particularly, the cold plate 1 is divided into thirty-six zones as shown in FIGS. 1 and 2. For example, B2 is proximate to zone C2, etc. The top and bottom target and spacer plates 7 and 10 each have recessed portions or grooves 20 in their surfaces for forming portions of the flow path 12 with a surface of an opposing plate of the heat exchanger layer 11.

Figure 3:
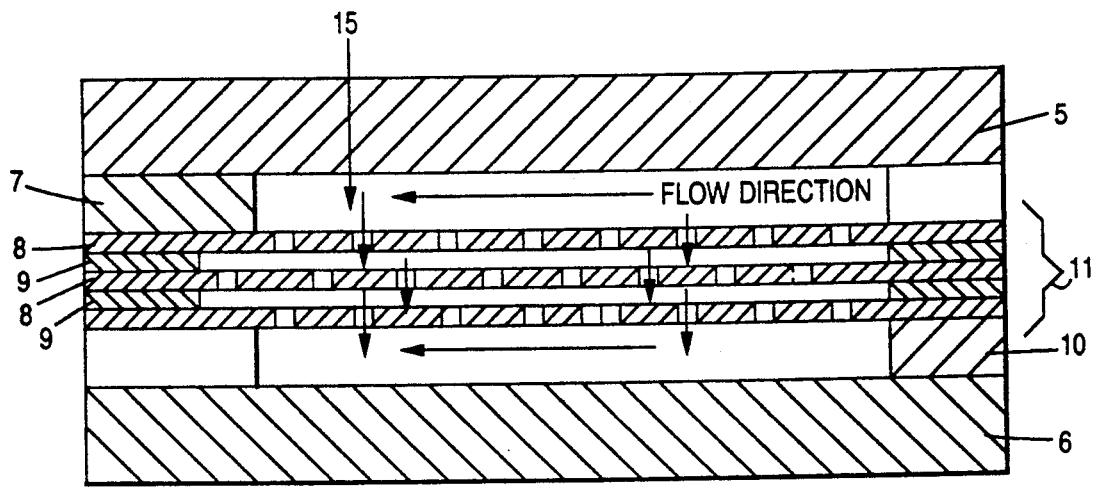
FIG. 3 is a cross-sectional view of a portion of the cold plate of FIGS. 1 and 2 taken along the line 3—3 in FIG. 2 and illustrating the relatively high cooling efficiency heat exchanger structure therein.
Figure 4:
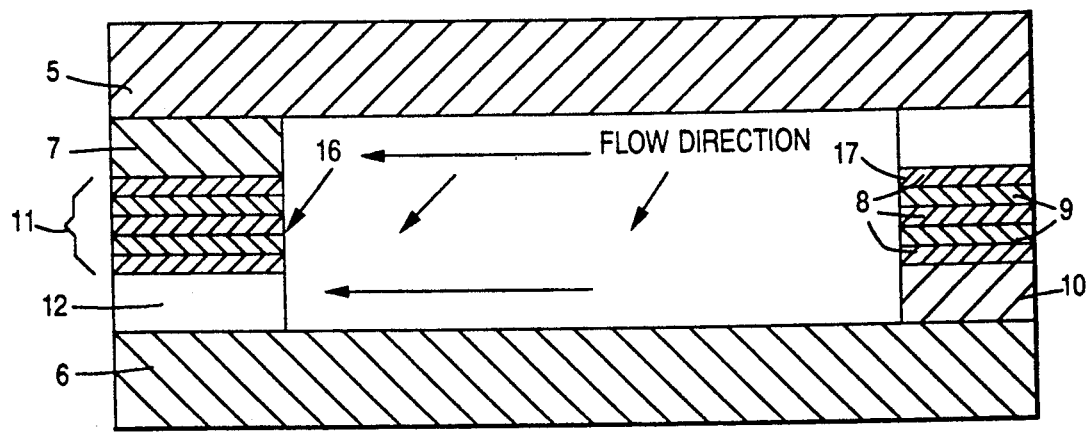
FIG. 4 is a cross-sectional view through another portion of the cold plate of FIGS. 1 and 2 taken along the line 4—4 in FIG. 2 and illustrating a relatively lower efficiency cooling heat exchanger structure.
Figure 5:
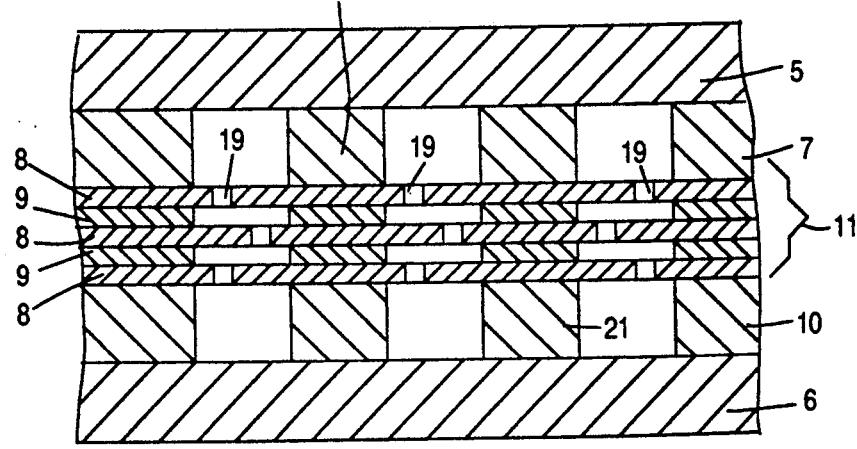
FIG. 5 is a cross-sectional view of the cold plate taken along the line 5—5 in FIG. 2, which is a view at right angles to that shown in FIG. 3.
Figure 6:
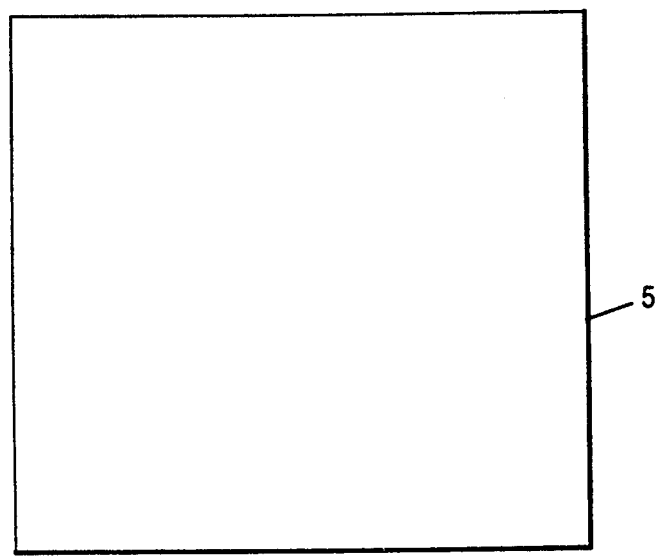
FIG. 6 is a top view of the top plate of the multi-layer cold plate of FIGS. 1 and 2.
Figure 7:
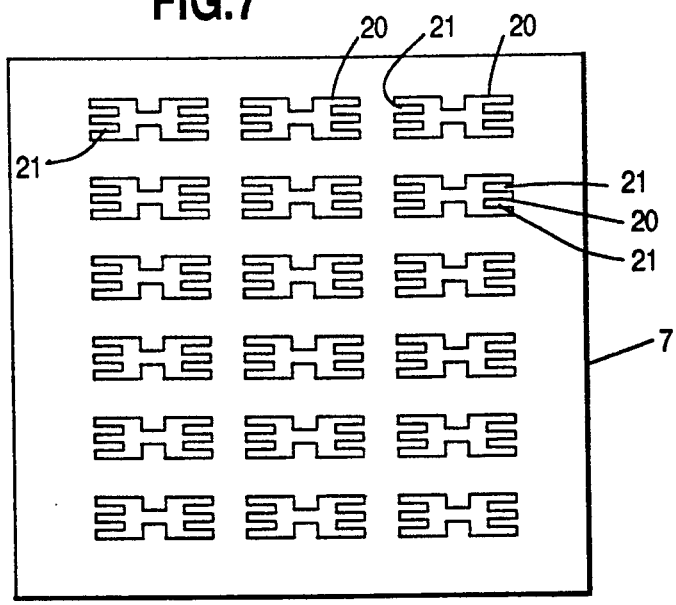
FIG. 7 is a top view of a top target spacer plate of the cold plate of the FIGS. 1 and 2; is a top view of an orifice plate of the heat exchanger layer of the cold plate of FIGS. 1 and 2.
Figure 8:
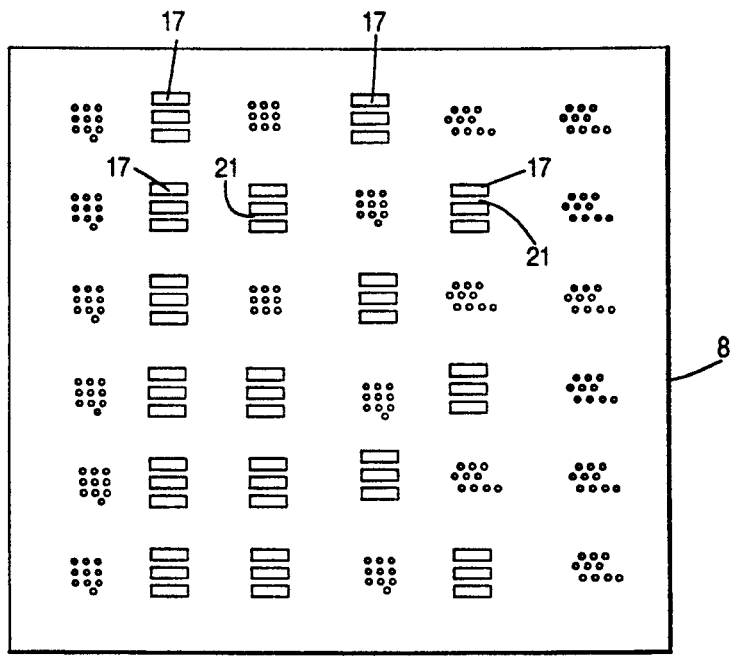
Figure 9:
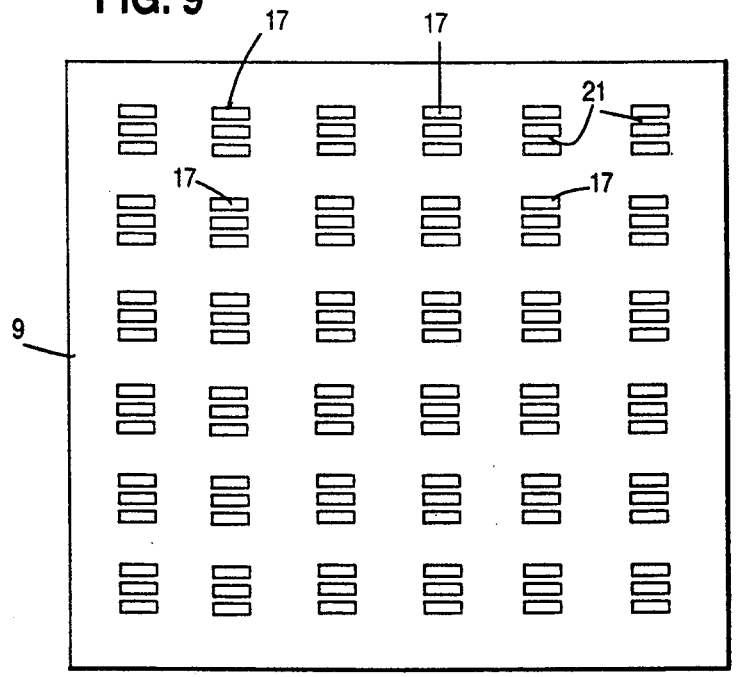
FIG. 9 is a top view of a spacer plate of the heat exchanger layer of the cold plate of FIGS. 1 and 2.
Figure 10:
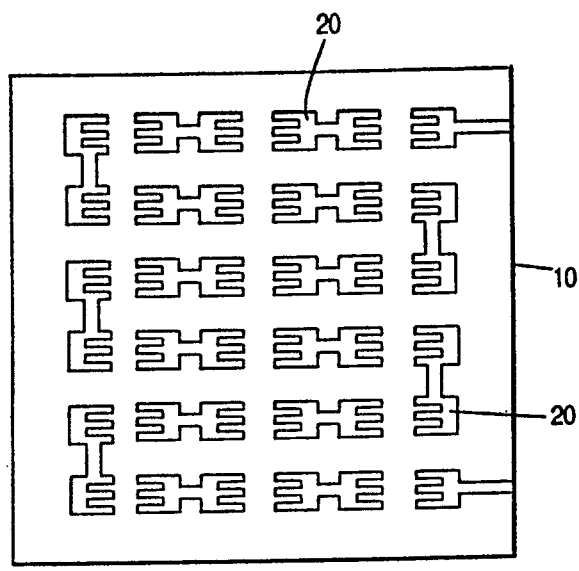
FIG. 10 is a top view of a bottom target spacer plate of the cold plate of FIGS. 1 and 2.

The heat exchanger layer in each of the cooling zones where the liquid coolant flows through the heat exchanger, is designed to have one of a first heat exchanger structure 15 for relatively high efficiency cooling, particularly a CHIC heat exchanger structure formed of the alternate orifice plates and spacer plates as shown in FIG. 3, and a second heat exchanger structure 16, for relatively lower efficiency cooling. To form heat exchanger structure 16 in the disclosed form of the invention, the several plates 8 and 9 forming the heat exchanger layer 11 are each formed with a relatively large aperture 17 therein at a given location corresponding to a certain cooling zone. The apertures 17 of the several plates 8 and 9 are aligned with one another to form a "blank" opening through which the liquid coolant can freely flow along the passage 12 from one of the top and bottom target spacer plates to the other as shown in FIG. 4. Solid areas stack up to form "conduction bars" 21 or fins to conduct heat from the top and bottom plates to the coolant. This is true of both the low and high efficiency heat exchangers.

Since the first and second heat exchanger structures 15 and 16 are located in respective ones of the cooling zones A1–F6, for heat removal efficiency a relatively high heat producing electronic component can be located adjacent one of the cooling zones with a first heat exchanger structure 15 associated therewith and a relatively lower heat producing electronic component can be located adjacent one of the cooling zones with a second heat exchanger structure 16 associated therewith. For example, the cold plate 1 in an area of a cooling zone E5 having a first heat exchanger structure 15 associated therewith can effectively dissipate extremely high local heat fluxes, $\geq 100$ watts/cm$^2$. Also, total heat loads of 500–2,000 watts per standard electronic module, size E, printed circuit board, can be dissipated with the cold plate 1 of the invention. Using a single phase pumped liquid coolant loop advantageously makes the system insensitive to "g" force and attitude. The pumped liquid loop system also has a relatively low pressure drop.

A method of customizing the multi-layered cold plate 1 of the invention through which the cooling liquid is to be flowed along flow passage 12 for cooling a plurality of electronic components of a printed circuit board or boards which produce different amounts of heat and which are to placed in a particular arrangement in thermal communication with a cold plate comprises dividing the cold plate into a plurality of hypothetical cooling zones, the thirty-six zones depicted in FIGS. 1 and 2, determining the cooling needed for the respective cooling zones for cooling the electronic components to be located adjacent the zones, and tailoring the heat exchanger layer 11 which is to formed only one layer of the multi-layered cold plate by providing at least two different heat exchanger structures therein having different cooling efficiencies, in respective ones of the cooling zones in accordance with the determined cooling needs of the cooling zones. That is, if normal cooling is required in a given cooling zone, the orifice plates 8 and spacer plates 9 of the heat exchanger layer 11 are both provided with a relatively large square hole or aperture 17 in that zone as indicated in FIG. 4. This permits the coolant to flow normally in thermal communication with the zone. If, however, very high cooling efficiency is required for a component producing high heat output, a CHIC-type heat exchanger structure is provided as shown in FIG. 3 wherein the orifice plates are formed with rows of relatively small apertures 19 which, for example, may range from a few thousandths of an inch in diameter up to several hundredths of an inch in diameter, for producing coolant flow in jets which impinge the adjacent orifice plate. The heat transfer coefficient with the first heat exchanger structure 15, a CHIC-type structure, is illustratively 5,000 BTU/hr./ft.$^2$/° F. In contrast, for the convention cooling arrangement with no jet impingement of the second heat exchanger structure 16 as shown in FIG. 4, the heat transfer coefficient is substantially lower, e.g. 500 BTU/hr./ft.$^2$/° F. As an example, the cross-sectional area of orifice plates in the area of each group of the apertures 17 of the heat exchanger structure 16 and also the cross-sectional area of the rows of small apertures 19 for each cooling zone is one centimeter by one centimeter, i.e. 1 cm$^2$. The combination of conduction and jet impingement cooling of the first heat exchanger structure 15 gives improved cooling, $\geq$100 watts/cm$^2$, as noted above, as compared with 10 watts/cm$^2$ for the second heat exchanger structure 16. With these dimensions, the cold plate 1 provides a plurality of intermittent or spaced cooled zones A1–F6 corresponding in size to a chip with the overall size of the cold plate being large enough to accommodate packages which may be bigger than chip size.

By having predetermined cooling zones, only the orifice plates 8 of the heat exchanger layer 11 must be "customized" by placing either an orifice hole pattern formed of the rows of small apertures 19 or a large apertures 17 in the predetermined locations, FIG. 2. Cost is further reduced by having standard hole patterns. High power devices can then be mounted on the cold plate above the orifice pattern locations, medium power devices can be mounted above the "blank" locations and low power devices can be mounted anywhere in the remaining board area, such as in zones 2F, 3F, 4F and 5F through which the passage 12 does not extend. Devices may be mounted on either side of the cold plate, since the CHIC cooling performance is approximately the same whether the cooling liquid is flowing toward a heat source or away.

While we have shown and described only one embodiment in accordance with the present invention, it is understood that the same is not limited thereto, but is susceptible to numerous changes and modifications as known to those skilled in the art. For example, the cold plate could have a configuration other than the planar or flat plate of the disclosed embodiment such that the term "cold plate" is not limited to the specific, disclosed configuration but is used in a general sense only. Therefore, I do not wish to be limited to the details shown and described herein, but intend to cover all such changes and modifications as are encompassed by the scope of the appended claims.

I claim:

1. A cold plate for cooling electronic components comprising a plurality of layers which are assembled in stacked relation, said plurality of layers including a heat exchanger layer, means defining a flow path for circulating a cooling liquid through said cold plate for cooling electronic components located in heat conducting relation to said cold plate, said flow path extending through a plurality of cooling zones of said cold plate, respective portions of said heat exchanger layer being located in said cooling zones for heat exchange with coolant circulated along the flow path, said respective portions of the heat exchanger layer including at least one first heat exchanger structure for relatively high efficiency cooling and at least one second heat exchanger structure for relatively lower efficiency cooling, each of said first and second heat exchanger structures being located in a respective one of said cooling zones whereby for heat removal efficiency a relatively high heat producing electronic component can be located adjacent one of said cooling zones with a first heat exchanger structure associated therewith and a relatively lower heat producing electronic component can be located adjacent one of said cooling zones with a second heat exchanger structure associated therewith.

2. A cold plate according to claim 1, wherein said plurality of layers further include a top plate and a bottom plate, said heat exchanger layer being located intermediate said top and bottom plates.

3. A cold plate according to claim 2, wherein said plurality of layers further comprise a top target spacer plate located between said top plate and said heat exchanger layer and a bottom target spacer plate located between said bottom plate and said heat exchanger layer, said flow path circulating cooling liquid through said heat exchanger layer in said cooling zones from one of said top and bottom target spacer plates to the other.

4. A cold plate according to claim 1, wherein said cold plate in a cooling zone having said first heat exchanger structure associated therewith is capable of effectively dissipating local heat fluxes of greater than or equal to 100 watts/cm$^2$ from a heat producing electronic component.

5. A cold plate according to claim wherein said plurality of layers include first and second layers arranged on opposite sides of said heat exchanger layer, said flow path in said cooling zones circulating cooling liquid through said heat exchanger layer from one of said first and second layers to the other.

6. A cold plate according to claim 5, wherein said liquid coolant flows through said heat exchanger layer in opposite directions in successive cooling zones along said flow path.

7. A cold plate according to claim 1, wherein said cold plate is planar with said flow path extending serpentine in the plane of said cold plate.

8. A cold plate according to claim 1, wherein said first heat exchanger structure comprises a plurality of orifice plates having coolant flow impingement orifices extending therethrough and spacer plates, said orifice plates and spacer plates being stacked alternately to provide for the removal of dissipated heat at relatively high heat fluxes from a relatively high heat producing electronic component.

9. A cold plate according to claim 8, wherein said stacked plates of said first heat exchanger structure are bonded to one another.

10. A cold plate according to claim 1, wherein said second heat exchanger structure comprises a plurality of stacked plates which each have a relatively large aperture therethrough with the apertures of the respective plates at a given cooling zone being aligned with one another for free flow of said coolant therethrough from one side of said heat exchanger layer to the opposite side in a direction along said flow path.

11. A cold plate according to claim 1, wherein at least one printed circuit board with a plurality of heat generating electronic components is connected in heat conducting relation to said cold plate such that the heat generating electronic components are located adjacent respective ones of said cooling zones for dissipating the heat generated thereby.

12. A cold plate according to claim 11, wherein a printed circuit board with a plurality of electronic components is connected in heat conducting relation on each of two opposite sides of said cold plate.

13. A cold plate according to claim 11, wherein said cold plate is capable of effectively dissipating heat fluxes from electronic components of greater than or equal to five hundred watts per printed circuit board attached to said cold plate.

14. A cold plate according to claim 1, wherein said heat exchanger layer is a composite structure formed of a plurality of plates.

15. A cold plate according to claim 1, wherein said cold plate is dimensioned to fit in a standard printed circuit board rack for supporting and cooling at least one printed circuit board and the electronic components thereof when the circuit board is attached to said cold plate.

16. A cold plate according to claim 1, wherein the plurality of stacked layers are bonded to one another.

17. A method of customizing a multi-layered cold plate through which a cooling liquid is to be flowed for cooling a plurality of electronic components which produce different amounts of heat and which are to be placed in a particular arrangement in thermal communication with a cold plate, said method comprising dividing the cold plate into a plurality of hypothetical cooling zones, determining the cooling needed for the respective cooling zones for cooling the electronic components to be located adjacent said zones, and tailoring a heat exchanger layer which is to form a part of the multi-layered cold plate by providing at respective portions of the heat exchanger layer at least two different heat exchanger structures having different cooling efficiencies and located in different cooling zones in accordance with the determined needs of the cooling zones.

18. A method according to claim 17, wherein said heat exchanger structures include a first heat exchanger structures comprising a plurality of alternately stacked orifice plates and spacer plates for the removal of relatively high heat fluxes.

19. A method according to claim 18, wherein said heat exchanger structures further comprise a second heat exchanger structure wherein said stacked plates each have a relatively large aperture therethrough with the apertures of the respective plates at a given cooling zone being aligned with one another for free flow of the coolant therethrough from the one side of the heat exchanger layer to the opposite side in a direction along the flow path.

20. A method of making a cold plate which is customized for cooling electronic components located in a particular arrangement on the cold plate, comprising forming the cold plate of at least three layers arranged in stacked relation with a liquid coolant flow path being formed therein which extends back and forth through an intermediate layer of said layers at a plurality of spaced located in the cold plate to define respective cooling zones, and wherein said intermediate layer is provided with at least one first heat exchanger structure for relatively high efficiency cooling and at least one second heat exchanger structure for relatively lower efficiency cooling in different cooling zones whereby for heat removal efficiency a relatively high heat producing electronic component can be located adjacent one of said cooling zones with a first heat exchanger structure associated therewith and a relatively lower heat producing electronic component can be located adjacent one of said cooling zones with a second heat exchanger structure associated therewith.

* * * * *